(12) United States Patent
Puckett

(10) Patent No.: US 9,467,143 B1
(45) Date of Patent: Oct. 11, 2016

(54) INVERSELY PROPORTIONAL VOLTAGE-DELAY BUFFERS FOR BUFFERING DATA ACCORDING TO DATA VOLTAGE LEVELS

(71) Applicant: QUALCOMM Incorporated, San Diego, CA (US)

(72) Inventor: Joshua Lance Puckett, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/863,710

(22) Filed: Sep. 24, 2015

(51) Int. Cl.
  *H03K 19/003* (2006.01)
  *H03K 19/0185* (2006.01)

(52) U.S. Cl.
  CPC .... *H03K 19/003* (2013.01); *H03K 19/018507* (2013.01)

(58) Field of Classification Search
  None
  See application file for complete search history.

(56) References Cited

U.S. PATENT DOCUMENTS

| | | | | |
|---|---|---|---|---|
| 5,120,992 A * | 6/1992 | Miller | .............. | H03K 19/00361 326/56 |
| 5,151,622 A * | 9/1992 | Thrower | .......... | H03K 19/01852 326/71 |
| 5,376,848 A * | 12/1994 | Hanke, III | ......... | H03K 3/35625 326/95 |
| 5,903,169 A * | 5/1999 | Kong | ..................... | G11C 11/412 326/121 |
| 6,031,393 A | 2/2000 | Wayner | | |
| 6,084,430 A * | 7/2000 | Wayner | ............ | H03K 19/00315 326/80 |
| 6,150,862 A | 11/2000 | Vikinski | | |
| 6,198,308 B1 | 3/2001 | Morrill | | |
| 6,232,797 B1 * | 5/2001 | Choi | .................... | G11C 7/1051 326/113 |
| 6,236,237 B1 | 5/2001 | Wong et al. | | |
| 6,292,041 B1 * | 9/2001 | Naffziger | ............... | G11C 19/00 327/172 |
| 7,098,694 B2 | 8/2006 | Bhattacharya et al. | | |
| 2002/0021151 A1 * | 2/2002 | Hirobe | ................. | H03K 17/693 327/112 |
| 2007/0085587 A1 * | 4/2007 | Lee | ........................ | G06F 1/3203 327/291 |
| 2007/0229133 A1 * | 10/2007 | Tam | ........................ | H03K 3/012 327/218 |

* cited by examiner

*Primary Examiner* — Crystal L Hammond
(74) *Attorney, Agent, or Firm* — Withrow & Terranova, PLLC

(57) ABSTRACT

Inversely proportional voltage-delay buffers for buffering data according to data voltage levels are disclosed. In one aspect, an inversely proportional voltage-delay buffer is configured to buffer a data signal for an amount of time that is inversely proportional to a voltage level of the data signal. The inversely proportional voltage-delay buffer includes an inversion circuit and pass circuit. The inversion circuit is configured to generate a control signal that is the logic inverse of the data signal. Notably, the control signal transitions at a rate proportional to the voltage level of the data signal. The pass circuit is configured to generate a weak logic state of the data signal when the data signal and the control signal have the same logic state. The pass circuit is configured to generate a strong logic state of the data signal when the data input and the control signal have opposite logic states.

21 Claims, 8 Drawing Sheets

INVERSELY PROPORTIONAL VOLTAGE-DELAY BUFFERS FOR BUFFERING DATA ACCORDING TO DATA VOLTAGE LEVELS

BACKGROUND

I. Field of the Disclosure

The technology of the disclosure relates generally to data buffers, and particularly to buffering time of such data buffers.

II. Background

Integrated circuits (ICs) designed with digital logic include multiple logic paths through which data may be transmitted. Each logic path has a corresponding delay, such that data transmitted through a particular logic path is received at an intended destination following the delay. The total delay corresponding to a particular logic path may include at least two types of delay, resistor-capacitor (RC) delay and gate delay. RC delay is attributable to the resistive and capacitive properties of metal components within the logic path, such as the wire on which the data is transmitted. Notably, the RC delay of a logic path remains constant across multiple voltage levels of transmitted data, because the resistive and capacitive properties of the logic path do not change with variations in voltage. Additionally, gate delay of a logic path is based on the number of logic gates within a logic path, as well as the switching speed of each logic gate. Thus, a gate delay of a logic path may increase if the logic gates switch more slowly due to a lower input voltage, and may decrease if the logic gates switch more quickly due to a higher input voltage.

Notably, each logic path within an IC may have an associated timing target that is affected by the delay of the logic path. For example, the delay of a logic path may cause data to arrive at a destination too early in time, thus generating logic errors in the IC. The timing of a logic path may be altered to help the logic path and IC achieve the associated timing targets so as to avoid logic errors. One way to alter the timing of a logic path is by inserting buffers into the logic path such that the buffers provide additional delay. For example, if a logic path has a race condition that causes data to arrive at a destination a certain number of clock cycles too early, one or more buffers may be inserted into the logic path such that the data is provided to the destination at the desired time.

Although inserting buffers into a logic path may allow the logic path to achieve timing targets when the provided data has a particular voltage, the logic path may fail to achieve timing targets when providing the data at other voltages. For example, the delay of a logic path at a higher voltage may be primarily attributable to RC delay. This is true because the higher voltage causes logic gates within the logic path to switch more quickly, thus reducing the gate delay associated with the logic path. Alternatively, the delay of a logic path at a lower voltage may be primarily attributable to gate delay. This is true because the lower voltage causes the logic gates within the logic path to switch more slowly, thus increasing the gate delay associated with the logic path. Thus, because the delay of a logic path may vary across higher and lower voltages, inserting buffers to achieve timing targets at one voltage may not achieve timing targets at another voltage. Therefore, it would be advantageous to employ buffers that could be used to achieve timing targets of logic paths in an IC across multiple voltage levels.

SUMMARY OF THE DISCLOSURE

Aspects disclosed in the detailed description include inversely proportional voltage-delay buffers for buffering data according to data voltage levels. In one aspect, an inversely proportional voltage-delay buffer is configured to buffer a data signal for an amount of time that is inversely proportional to a voltage level of the data signal. For example, the inversely proportional voltage-delay buffer may hold a higher voltage data signal for a shorter delay, but hold a lower voltage data signal for a longer delay. To provide delays that are inversely proportional to the voltage levels, the inversely proportional voltage-delay buffer includes an inversion circuit and a pass circuit. The inversion circuit is configured to generate a control signal that is the logic inverse of the data signal. Notably, the control signal transitions at a rate proportional to the voltage level of the data signal. The pass circuit is configured to generate a weak logic state of the data signal when the data signal and the control signal have the same logic state. In other words, the pass circuit is configured to generate a weak logic state when the data signal transitions to another logic state but before the control signal transitions to the opposite logic state of the data signal. Notably, a weak logic state based on a lower voltage data signal is not capable of triggering a next stage of a logic path. Further, the pass circuit is configured to generate a strong logic state of the data signal when the data signal and the control signal have opposite logic states. In other words, the pass circuit is configured to generate a strong logic state after the inversion circuit has had time to generate the control signal that is the inverse logic state of the data signal. A strong logic state of either a lower or higher voltage data signal is capable of triggering a next stage in a logic path. Because the control signal transition rate is proportional to the voltage level of the data signal, data signals are buffered for an amount of time according to such voltage levels. Thus, the inversely proportional voltage-delay buffer may be used to achieve timing targets of logic paths in an IC across multiple voltage levels.

In this regard, in one aspect, an inversely proportional voltage-delay buffer is disclosed. The inversely proportional voltage-delay buffer comprises an inversion circuit configured to generate a control signal having an inverted logic state of a data input signal, wherein a transition rate of the control signal is proportional to a voltage level of the data input signal. The inversely proportional voltage-delay buffer further comprises a pass circuit. The pass circuit comprises a first pass device. The first pass device is configured to generate a data output signal having a weak logic state of the data input signal in response to the data input signal and the control signal having a first logic state. The first pass device is further configured to generate the data output signal having a strong logic state of the data input signal in response to the control signal having the first logic state and the data input signal having a second logic state, wherein the second logic state is opposite of the first logic state. The pass circuit further comprises a second pass device. The second pass device is configured to generate the data output signal having a weak logic state of the data input signal in response to the data input signal and the control signal having the second logic state. The second pass device is further configured to generate the data output signal having a strong logic state of the data input signal in response to the control signal having the second logic state and the data input signal having the first logic state.

In another aspect, an inversely proportional voltage-delay buffer is disclosed. The inversely proportional voltage-delay buffer comprises a means for generating a control signal having an inverted logic state of a data input signal, wherein a transition rate of the control signal is proportional to a voltage level of the data input signal. The inversely proportional voltage-delay buffer further comprises a means for generating a data output signal having a weak logic state of the data input signal in response to the data input signal and the control signal having a first logic state. The inversely proportional voltage-delay buffer further comprises a means for generating the data output signal having a strong logic state of the data input signal in response to the control signal having the first logic state and the data input signal having a second logic state, wherein the second logic state is opposite of the first logic state. The inversely proportional voltage-delay buffer further comprises a means for generating the data output signal having a weak logic state of the data input signal in response to the data input signal and the control signal having the second logic state. The inversely proportional voltage-delay buffer further comprises a means for generating the data output signal having a strong logic state of the data input signal in response to the control signal having the second logic state and the data input signal having the first logic state.

In another aspect, a method for buffering a data input signal for an amount of time that is inversely proportional to a voltage level of the data input signal is disclosed. The method comprises generating a control signal having an inverted logic state of a data input signal, wherein a transition rate of the control signal is proportional to a voltage level of the data input signal. The method further comprises generating a data output signal having a weak logic state of the data input signal in response to the data input signal and the control signal having a first logic state. The method further comprises generating the data output signal having a strong logic state of the data input signal in response to the control signal having the first logic state and the data input signal having a second logic state, wherein the second logic state is opposite of the first logic state. The method further comprises generating the data output signal having a weak logic state of the data input signal in response to the data input signal and the control signal having the second logic state. The method further comprises generating the data output signal having a strong logic state of the data input signal in response to the control signal having the second logic state and the data input signal having the first logic state.

In another aspect, an inversely proportional voltage-delay buffer is disclosed. The inversely proportional voltage-delay buffer comprises an inverter configured to generate a control signal having an inverted logic state of a data input signal, wherein a transition rate of the control signal is proportional to a voltage level of the data input signal. The inversely proportional voltage-delay buffer further comprises a pass gate. The pass gate comprises a p-type metal oxide semiconductor (PMOS) transistor. The PMOS transistor comprises a gate configured to receive the control signal, a source configured to receive the data input signal, and a drain configured to provide a data output signal. The pass gate further comprises an n-type metal oxide semi-conductor (NMOS) transistor. The NMOS transistor comprises a gate configured to receive the control signal, a source configured to receive the data input signal, and a drain configured to provide the data output signal.

DETAILED DESCRIPTION

Figure 1B:
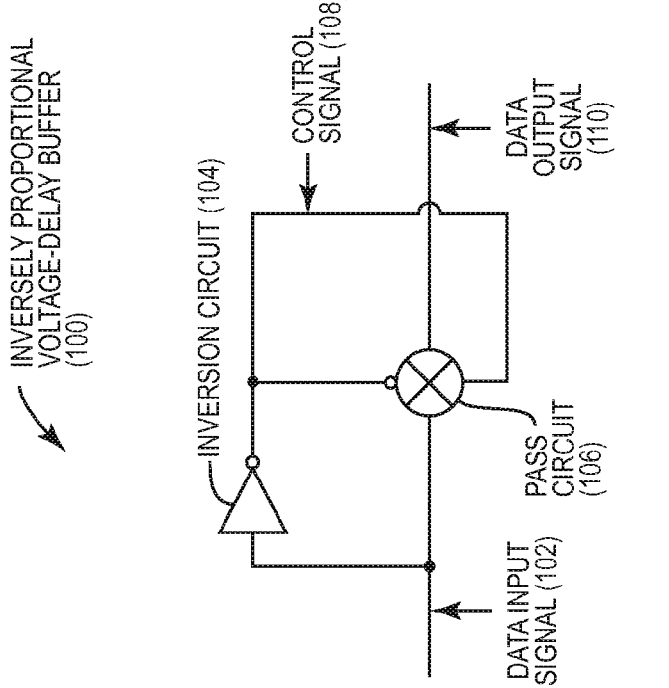
FIG. 1B is a logic diagram of the inversely proportional voltage-delay buffer in FIG. 1A.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Figure 1A:
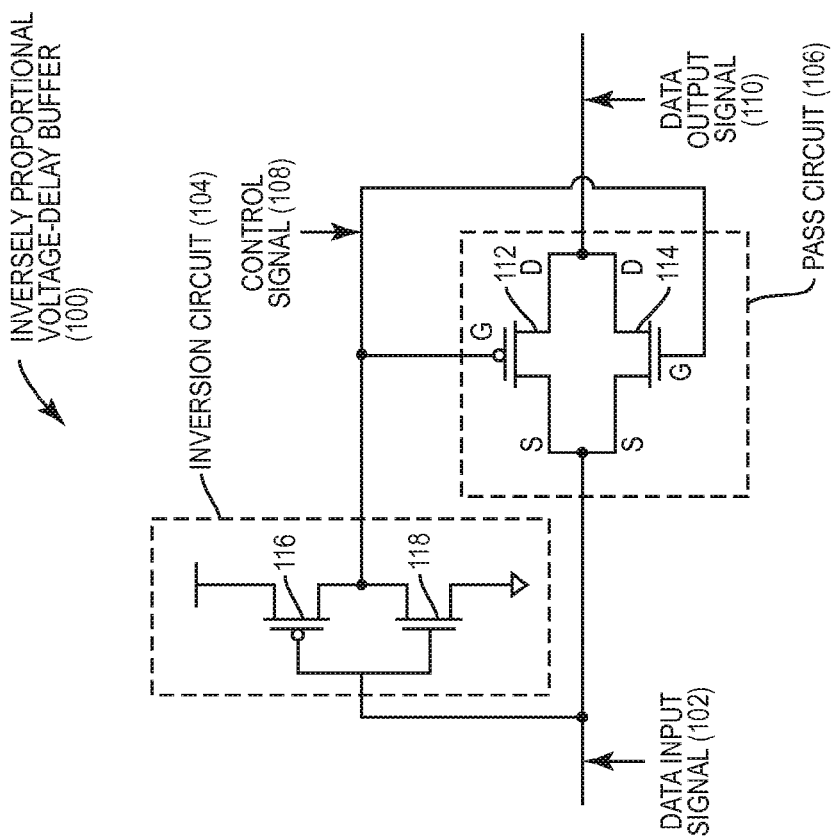
FIG. 1A is a circuit diagram of an exemplary inversely proportional voltage-delay buffer configured to buffer a data input signal for an amount of time that is inversely proportional to a voltage level of the data input signal.

FIG. 1A is a circuit diagram of an exemplary inversely proportional voltage-delay buffer 100 configured to buffer a data input signal 102 for an amount of time that is inversely proportional to a voltage level of the data input signal 102. As a non-limiting example, the inversely proportional voltage-delay buffer 100 may hold the data input signal 102 having a higher voltage level for a shorter delay, but hold the data input signal 102 having a lower voltage level for a longer delay. To provide delays that are inversely proportional to the voltage levels in this manner, the inversely proportional voltage-delay buffer 100 includes an inversion circuit 104 and a pass circuit 106. The inversion circuit 104 is configured to generate a control signal 108 having an inverted logic state of the data input signal 102. Notably, the control signal 108 transitions at a rate proportional to the voltage level of the data input signal 102.

With continuing reference to FIG. 1A, the pass circuit 106 is configured to generate a data output signal 110 having a weak logic state of the data input signal 102 when the data input signal 102 and the control signal 108 have the same logic state. In other words, the pass circuit 106 is configured to generate the data output signal 110 having a weak logic state when the data input signal 102 transitions to another logic state but before the control signal 108 transitions to the opposite logic state of the data input signal 102. Further, the pass circuit 106 is configured to generate the data output signal 110 having a strong logic state of the data input signal 102 when the data input signal 102 and the control signal 108 have opposite logic states. In other words, the pass circuit 106 is configured to generate a strong logic state after the inversion circuit 104 has had time to generate the control signal 108 that is the inverse logic state of the data input signal 102. Notably, a strong logic state of either a lower or higher voltage data input signal 102 is capable of triggering a next stage in a logic path.

With continuing reference to FIG. 1A, to generate the data output signal 110 as described above, the pass circuit 106 includes a first pass device 112 and a second pass device 114. The first pass device 112 is configured to generate the data output signal 110 having a weak logic state of the data input signal 102 in response to the data input signal 102 and the control signal 108 having a first logic state. Conversely, the second pass device 114 is configured to generate the data output signal 110 having a weak logic state in response to the data input signal 102 and the control signal 108 having a second logic state, wherein the second logic state is opposite of the first logic state. Notably, a weak logic state based on the data input signal 102 having a lower voltage level is not capable of triggering a next stage of a logic path.

Further, the first pass device 112 is configured to generate the data output signal 110 having a strong logic state of the data input signal 102 in response to the control signal 108 having the first logic state and the data input signal 102 having the second logic state. The second pass device 114 is further configured to generate the data output signal 110 having a strong logic state of the data input signal 102 in response to the control signal 108 having the second logic state and the data input signal 102 having the first logic state. Importantly, a strong logic state of either a lower or higher voltage data input signal 102 is capable of triggering a next stage in a logic path. Because the transition rate of the control signal 108 is proportional to the voltage level of the data input signal 102, the data input signal 102 is buffered for an amount of time according to such voltage levels. Thus, the inversely proportional voltage-delay buffer 100 may be used to achieve timing targets of logic paths in an integrated circuit (IC) across multiple voltage levels.

With continuing reference to FIG. 1A, an exemplary aspect of the inversely proportional voltage-delay buffer 100 is now described. In this example, the first pass device 112 is employed using a p-type metal oxide semi-conductor (PMOS) transistor (also referred to herein as "PMOS transistor 112"), while the second pass device 114 is employed using an n-type metal oxide semi-conductor (NMOS) transistor (also referred to herein as "NMOS transistor 114"). A source (S) of the PMOS transistor 112 is electrically coupled to a source (S) of the NMOS transistor 114, and each source (S) is configured to receive the data input signal 102. Further, a drain (D) of the PMOS transistor 112 is electrically coupled to a drain (D) of the NMOS transistor 114, and each drain (D) is configured to provide the data output signal 110. A gate (G) of the PMOS transistor 112 and a gate (G) of the NMOS transistor 114 are each configured to receive the control signal 108. Notably, when employing the PMOS transistor 112 and the NMOS transistor 114 in this manner, the pass circuit 106 may also be known as a pass gate (also referred to herein as "pass gate 106"). Additionally, in this example, the inversion circuit 104 is employed using an inverter (also referred to herein as "inverter 104"). The inverter 104 includes a PMOS transistor 116 electrically coupled to an NMOS transistor 118. To provide further clarification, FIG. 1B illustrates a logic diagram of the inversely proportional voltage-delay buffer 100 in this example that includes the pass circuit 106 using the pass gate and the inversion circuit 104 using the inverter.

As described in more detail below, the inversely proportional voltage-delay buffer 100 takes advantage of weak and strong logic states caused by device physics of the PMOS transistor 112 and the NMOS transistor 114 of the pass circuit 106. In this manner, when the PMOS transistor 112 is activated, the PMOS transistor 112 is configured to generate a strong logic high '1' state on the drain (D) when a logic high '1' state is provided to the source (S), and generate a weak logic low '0' state on the drain (D) when a logic low '0' state is provided to the source (S). As a non-limiting example, the PMOS transistor 112 has a threshold voltage ($V_T$) equal to −0.2 Volts (V). If 0 V is provided to the source (S) of the PMOS transistor 112, upon activation of the gate (G), the PMOS transistor 112 generates a drain voltage ($V_D$) equal to 0.2 V (e.g., 0 V+0.2 V=0.2 V), which is a weak logic low '0' state. If 1.0 V is provided to the source (S) of the PMOS transistor 112, upon activation of the gate (G), the PMOS transistor 112 generates the $V_D$ equal to 1.0 V, which is a strong logic high '1' state.

Additionally, when the NMOS transistor 114 is activated, the NMOS transistor 114 is configured to generate a strong logic low '0' state on the drain (D) when a logic low '0' state is provided to the source (S), and generate a weak logic high '1' state on the drain (D) when a logic high '1' state is provided to the source (S). As a non-limiting example, the NMOS transistor 114 has a $V_T$ equal to 0.2 V. If 1.0 V is provided to the source (S) of the NMOS transistor 114, upon activation of the gate (G), the NMOS transistor 114 generates a $V_D$ equal to 0.8 V (e.g., 1.0 V−0.2 V=0.8 V), which is a weak logic high '1' state. If 0 V is provided to the source (S) of the NMOS transistor 114, upon activation of the gate (G), the NMOS transistor 114 generates the $V_D$ equal to 0 V, which is a strong logic low '0' state.

Figure 2:
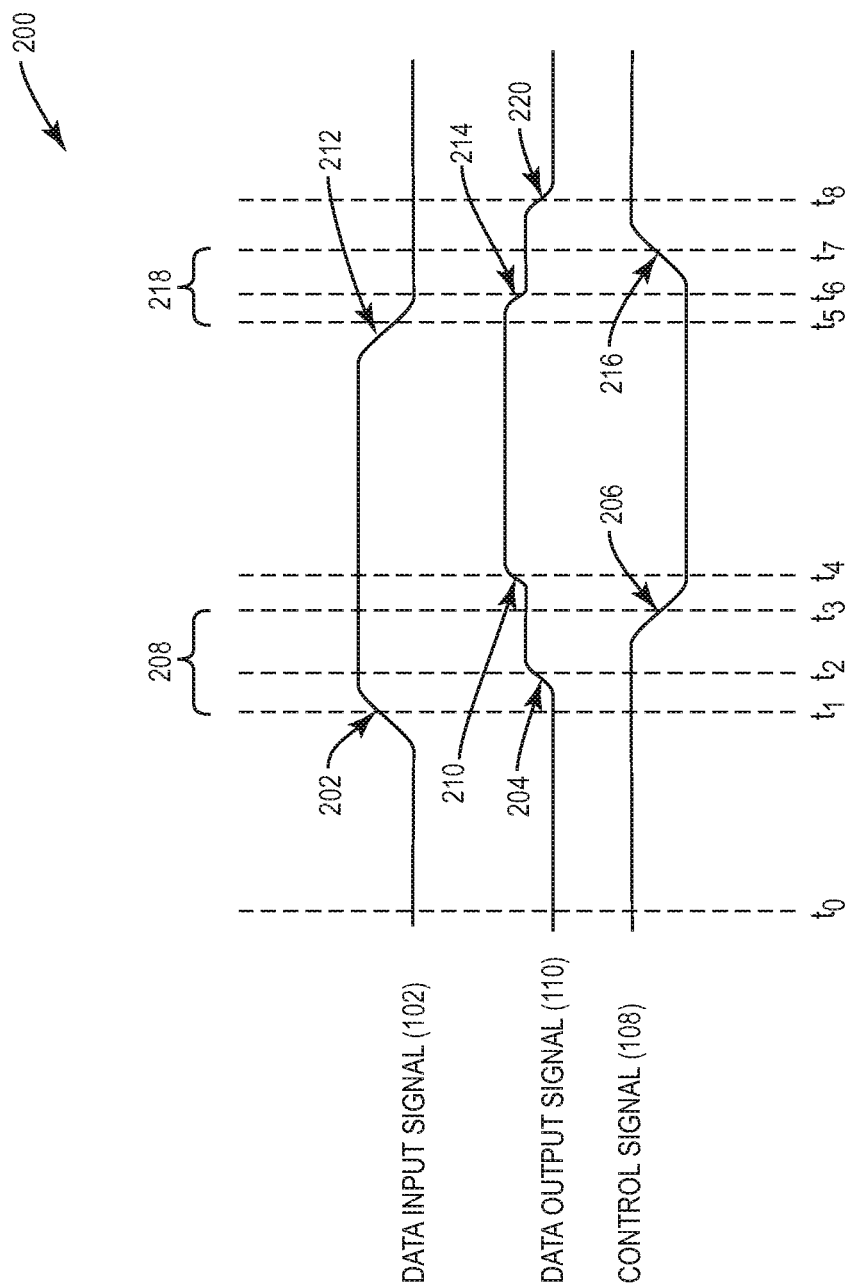
FIG. 2 is a timing diagram illustrating exemplary timings of signals of the inversely proportional voltage-delay buffer in FIG. 1A in response to transitions of the data input signal.

In this regard, FIG. 2 provides a timing diagram 200 illustrating exemplary timings of signals of the inversely proportional voltage-delay buffer 100 in FIG. 1A in response to transitions of the data input signal 102. In this example, the first logic state is equivalent to a logic low '0' state, and the second logic state is equivalent to a logic high '1' state. Further, in this example, the $V_T$ of the NMOS transistor 114 is assumed to be 0.2 V, while the $V_T$ of the PMOS transistor 112 is assumed to be −0.2 V. Also, the data input signal 102 at a higher voltage level is assumed to be 1.0 V, while the data input signal 102 at a lower voltage level is assumed to be 0.3 V.

With continuing reference to FIG. 2, at time $t_0$, the data input signal 102 and the data output signal 110 both have a logic low '0' state, while the control signal 108 has a logic high '1' state. Thus, at time $t_0$, the NMOS transistor 114 is activated by a logic high '1' state of the control signal 108 such that the pass gate 106 generates the data output signal 110 having a strong logic low '0' state of the data input signal 102 (e.g., 0 V). At time $t_1$, the data input signal 102 transitions to a logic high '1' state (arrow 202). Because the control signal 108 has a logic high '1' state at time $t_2$, the NMOS transistor 114 remains activated, and thus, the NMOS transistor 114 generates the data output signal 110 having a weak logic high '1' state of the data input signal 102 at time $t_2$ (arrow 204). For example, if the data input signal 102 has a higher voltage level of 1.0 V, the data output signal 110 has a weak logic high '1' state equal to 0.8 V at time $t_2$ (e.g., 1.0 V−0.2 V=0.8 V). Notably, a weak logic high '1' state equal to 0.8 V may be high enough to allow the data output signal 110 to trigger a next stage in a logic path. On the other hand, if the data input signal 102 has a lower voltage level of 0.3 V, the data output signal 110 has a weak logic high '1' state equal to 0.1 V at time $t_2$ (e.g., 0.3 V−0.2 V=0.1 V), which is not high enough to allow the data output signal 110 to trigger a next stage of a logic path.

With continuing reference to FIG. 2, at time $t_3$, the inverter 104 generates the control signal 108 having a logic low '0' state (arrow 206) in response to the data input signal 102 having a logic high '1' state. Notably, because the transition rate of the control signal 108 is proportional to the voltage level of the data input signal 102, a delay 208 from the data input signal 102 transitioning at time $t_1$ until the control signal 108 transitions at time $t_3$ is inversely proportional to the voltage level of the data input signal 102. In other words, a higher voltage level of the data input signal 102 results in the delay 208 having a shorter duration due to faster switching of the inverter 104, while a lower voltage level of the data input signal 102 results in the delay 208 having a longer duration due to slower switching of the inverter 104. Further, the logic low '0' state of the control signal 108 at time $t_3$ activates the PMOS transistor 112 and deactivates the NMOS transistor 114. In response to activation of the PMOS transistor 112, the data output signal 110 is generated having a strong logic high '1' state of the data input signal 102 at time $t_4$ (arrow 210). For example, if the data input signal 102 has a higher voltage level of 1.0 V, the data output signal 110 has a strong logic high '1' state equal to 1.0 V at time $t_4$. On the other hand, if the data input signal 102 has a lower voltage level of 0.3 V, the data output signal 110 has a strong logic high '1' state equal to 0.3 V at time $t_4$. Notably, the strong logic high '1' state of either 1.0 V or 0.3 V is high enough to allow the data output signal 110 to trigger a next stage in a logic path.

Thus, as illustrated by the example described above in relation to FIG. 2, the inversely proportional voltage-delay buffer 100 in FIG. 1A is configured to buffer the data input signal 102 for an amount of time that is inversely proportional to the voltage level of the data input signal 102. For example, if the data input signal 102 has a lower voltage level, the weak logic high '1' state of the data output signal 110 at time $t_2$ is not high enough to trigger a next stage of a logic path. However, when the data input signal 102 has a lower voltage level, the data output signal 110 is high enough to trigger a next state of a logic path once the data output signal 110 reaches a strong logic high '1' state at time $t_4$. Because the lower voltage level of the data input signal 102 causes the delay 208 to have a longer duration, the data output signal 110 is delayed from reaching the strong logic high '1' state due to the lower voltage level of the data input signal 102. Conversely, if the data input signal 102 has a higher voltage level, the weak logic high '1' state of the data output signal 110 at time $t_2$ may be high enough to trigger a next stage of a logic path. However, even if the weak logic high '1' state of the data output signal 110 is not high enough at time $t_2$, the data output signal 110 is high enough to trigger a next state of a logic path once the data output signal 110 reaches a strong logic high '1' state at time $t_4$. Further, because the higher voltage level of the data input signal 102 causes the delay 208 to have a shorter duration, the data output signal 110 reaches the strong logic high '1' state more quickly as compared to when the data input signal 102 has a lower voltage level. Therefore, the inversely proportional voltage-delay buffer 100 in FIG. 1A may be used to achieve timing targets of logic paths in an IC across multiple voltage levels.

With continuing reference to FIG. 2, the timing of exemplary signals of the inversely proportional voltage-delay buffer 100 in FIG. 1A during a falling transition of the data input signal 102 is now described. In this regard, at time $t_5$, the data input signal 102 transitions to a logic low '0' state (arrow 212). Because the control signal 108 has a logic low '0' state at time $t_6$, the PMOS transistor 112 remains activated, and thus, the data output signal 110 is generated having a weak logic low '0' state of the data input signal 102 at time $t_6$ (arrow 214). For example, because of the device physics of the PMOS transistor 112 as previously described, the data output signal 110 has a weak logic low '0' state equal to 0.2 V (e.g., 0 V+0.2 V=0.2 V) at time $t_6$. Further, at time $t_7$, the inverter 104 generates the control signal 108 having a logic high '1' state (arrow 216) in response to the data input signal 102 having a logic low '0' state. The time between the data input signal 102 transitioning at time $t_5$ until the control signal 108 transitions at time $t_7$ is described herein as delay 218. The logic high '1' state of the control signal 108 activates the NMOS transistor 114 and deactivates the PMOS transistor 112. In response to activation of the NMOS transistor 114, the data output signal 110 is generated having a strong logic low '0' state of the data input signal 102 at time $t_8$ (arrow 220).

Figure 3:
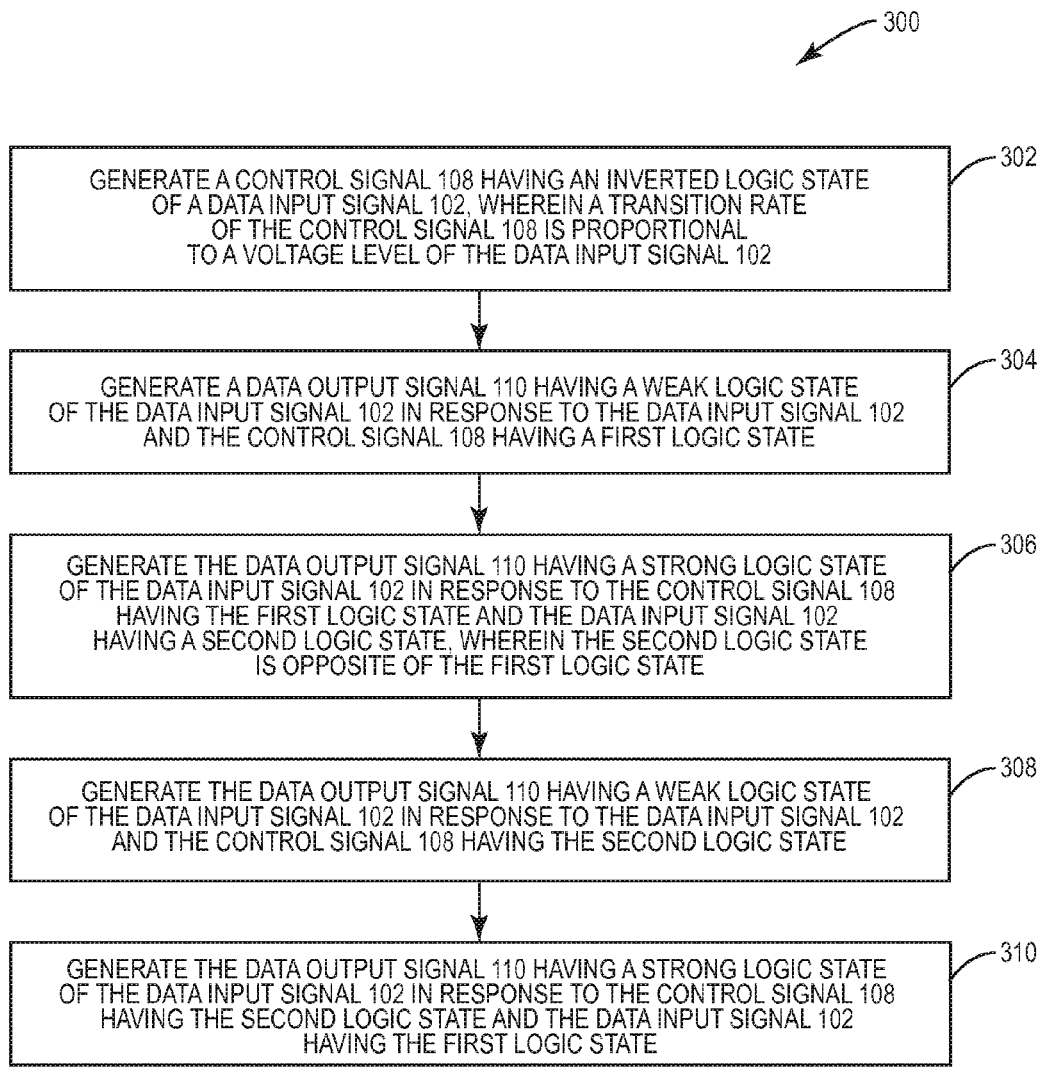
FIG. 3 is a flowchart of an exemplary process employed by the inversely proportional voltage-delay buffer in FIG. 1A to buffer the data input signal for an amount of time that is inversely proportional to the voltage level of the data input signal.

In this regard, FIG. 3 illustrates an exemplary process 300 employed by the inversely proportional voltage-delay buffer 100 in FIG. 1A to buffer the data input signal 102 for an amount of time that is inversely proportional to the voltage level of the data input signal 102. The process 300 includes generating the control signal 108 having an inverted logic state of the data input signal 102 (block 302). Notably, the transition rate of the control signal 108 is proportional to a voltage level of the data input signal 102. The process 300 also includes generating the data output signal 110 having a weak logic state of the data input signal 102 in response to the data input signal 102 and the control signal 108 having the first logic state (block 304). Further, the process 300 includes generating the data output signal 110 having a strong logic state of the data input signal 102 in response to the control signal 108 having the first logic state and the data input signal 102 having the second logic state (block 306). As noted above, the second logic state is opposite of the first logic state. The process 300 also includes generating the data output signal 110 having a weak logic state of the data input signal 102 in response to the data input signal 102 and the control signal 108 having the second logic state (block 308). Further, the process 300 includes generating the data output signal 110 having a strong logic state of the data input signal 102 in response to the control signal 108 having the second logic state and the data input signal 102 having the first logic state (block 310). By employing the process 300, the inversely proportional voltage-delay buffer 100 in FIG. 1A may be used to achieve timing targets of logic paths in an IC across multiple voltage levels.

Figure 4:
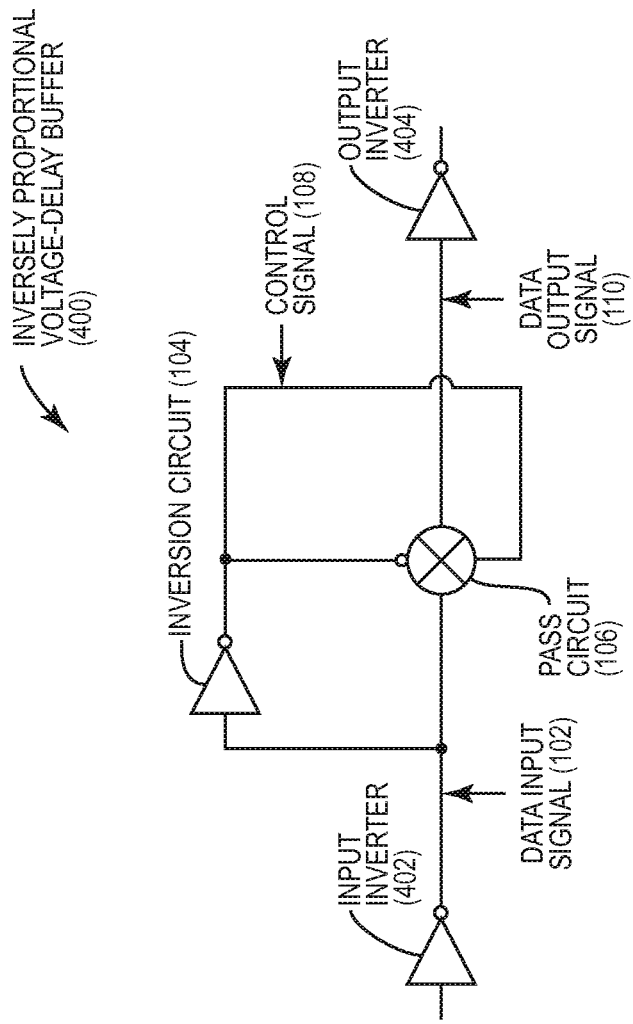
FIG. 4 is a logic diagram of another inversely proportional voltage-delay buffer that includes input and output inverters for drive strength purposes.

As noted above, instances of the inversely proportional voltage-delay buffer 100 in FIG. 1A may be disposed in various logic paths of an IC to achieve timing targets. However, the physical dynamics of a particular logic path in which an instance of the inversely proportional voltage-delay buffer 100 in FIG. 1A is disposed may affect the voltage level of data provided to or received from the inversely proportional voltage-delay buffer 100. In this manner, FIG. 4 is a logic diagram of an exemplary inversely proportional voltage-delay buffer 400 that includes an input inverter 402 and an output inverter 404 for drive strength purposes. The inversely proportional voltage-delay buffer 400 includes certain components in common with the inversely proportional voltage-delay buffer 100 in FIG. 1A, which are shown with common element numbers between FIGS. 1A and 4, and thus, will not be re-described herein. In this example, the input inverter 402 is configured to receive data from a logic path and generate the data input signal 102. Further, the input inverter 402 is electrically coupled to the inversion circuit 104 and the pass circuit 106 such that the input inverter 402 provides the data input signal 102 to the inversion circuit 104 and the pass circuit 106. The output inverter 404 is electrically coupled to the pass circuit 106, and is configured to receive the data output signal 110 and generate data for the logic path. In this manner, the input inverter 402 and the output inverter 404 increase the drive strength of data provided to and received from the inversely proportional voltage-delay buffer 400.

Figure 5:
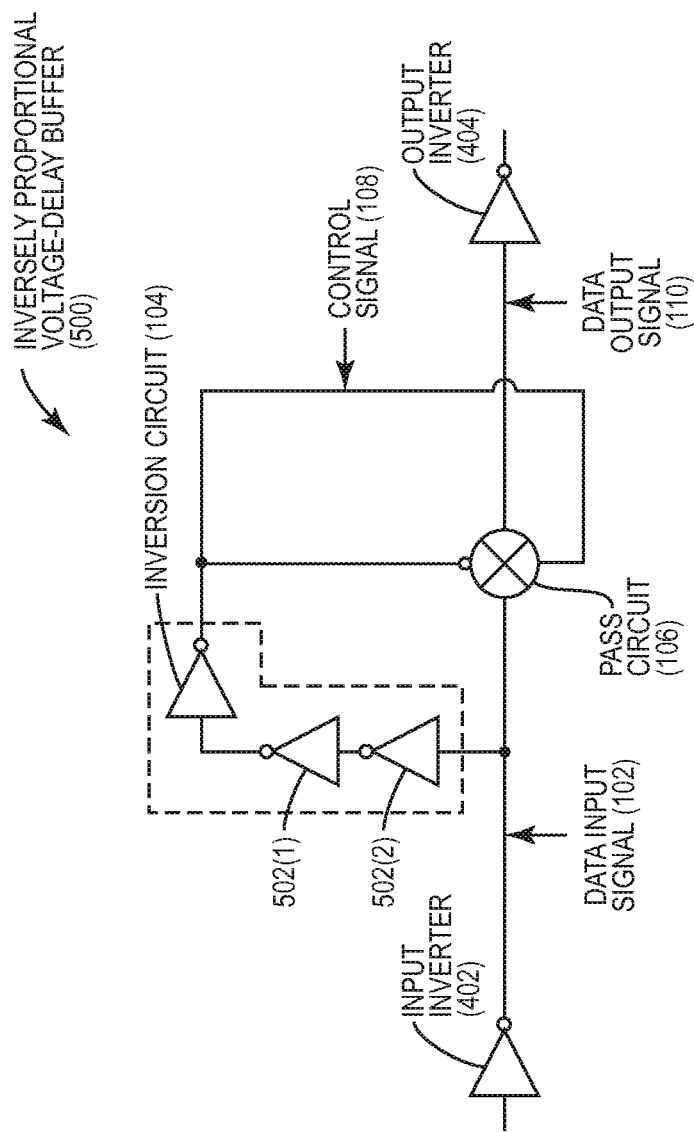
FIG. 5 is a logic diagram of another inversely proportional voltage-delay buffer that includes additional inverters for increasing delay, particularly at lower voltage levels of a data input signal.

Additionally, it may be helpful to have additional control over the duration of the delay 208 described above in reference to FIG. 2 so as to more easily achieve timing targets of some logic paths at lower voltage levels. In this regard, FIG. 5 is a logic diagram of an exemplary inversely proportional voltage-delay buffer 500 that includes additional inverters 502(1), 502(2) configured to increase delay, particularly at lower voltage levels of the data input signal 102. The inversely proportional voltage-delay buffer 500 includes certain components in common with the inversely proportional voltage-delay buffer 400 in FIG. 4, which are shown with common element numbers between FIGS. 4 and 5, and thus, will not be re-described herein. In this example, the inverters 502(1), 502(2) are serially-connected and configured to provide the data input signal 102 to the inversion circuit 104. The inverters 502(1), 502(2) may increase delay particularly at lower voltage levels of the data input signal 102 because the switching speed of the inverters 502(1), 502(2) is slower at lower voltage levels and faster at higher voltage levels. Further, in this aspect, the inverters 502(1), 502(2) are disposed within the inversion circuit 104. However, other aspects may implement the inverters 502(1), 502(2) separately from the inversion circuit 104. Notably, in the aspects described herein, any even number (N) of inverters 502(1)-502(N) may be used so that an increase in delay attributable to the inverters 502(1)-502(N) may be more finely controlled based on the number of inverters 502(1)-502(N) employed. Thus, aspects including the inverters 502(1)-502(N) and the inverter 104 have an odd number (P) of inverters generally for the inversion circuit 104 and the associated delay of the inverters 502(1)-502(N).

Figure 6:
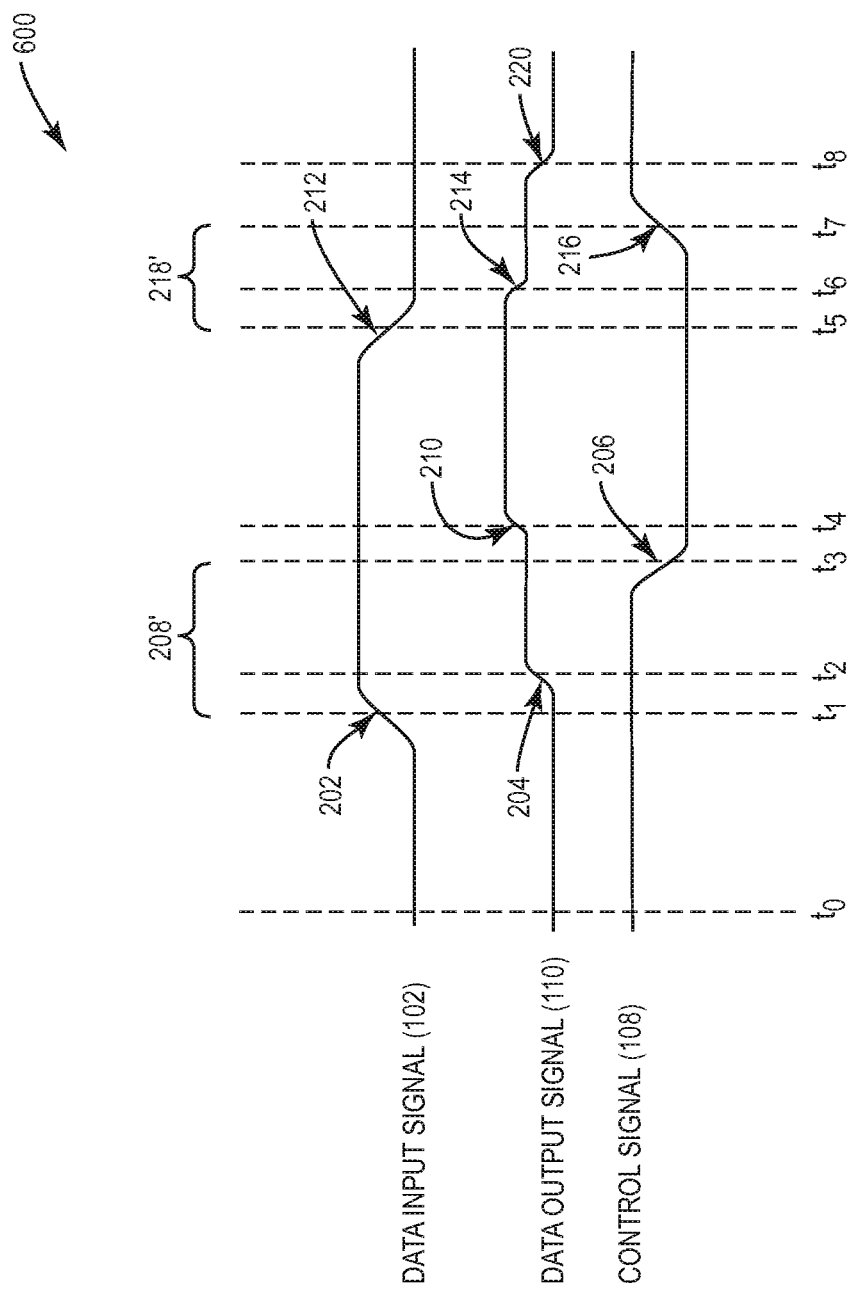
FIG. 6 is a timing diagram illustrating exemplary timings of signals of the inversely proportional voltage-delay buffer in FIG. 5 in response to transitions of the data input signal.

In this regard, FIG. 6 provides a timing diagram 600 illustrating exemplary timings of signals of the inversely proportional voltage-delay buffer 500 in FIG. 5 in response to transitions of the data input signal 102. The timing diagram 600 includes certain transitions in common with the timing diagram 200 in FIG. 2, which are shown with common element numbers between FIGS. 2 and 6, and thus, will not be re-described herein. In this manner, the switching speed of the inverters 502(1), 502(2) in the inversely proportional voltage-delay buffer 500 in FIG. 5 increases the time between the data input signal 102 transitioning to a logic high '1' state at time $t_1$ and the control signal 108 transitioning to a logic low '0' state at time $t_3$. In other words, the inverters 502(1), 502(2) cause a delay 208' between the above described transitions. Notably, the delay 208' has a longer duration than the delay 208 described in the timing diagram 200 in FIG. 2 due to the increased delay added by the inverters 502(1), 502(2). Similarly, the inverters 502(1), 502(2) increase the time between the data input signal 102 transitioning to a logic low '0' state at time $t_5$ and the control signal 108 transitioning to a logic high '1' state at time $t_7$, such that the delay 218' has a longer duration than the delay 218 in FIG. 2. Therefore, the inverters 502(1), 502(2) may be used to increase delay particularly at lower voltage levels of the data input signal 102 in the inversely proportional voltage-delay buffer 500 in FIG. 5.

Figure 7:
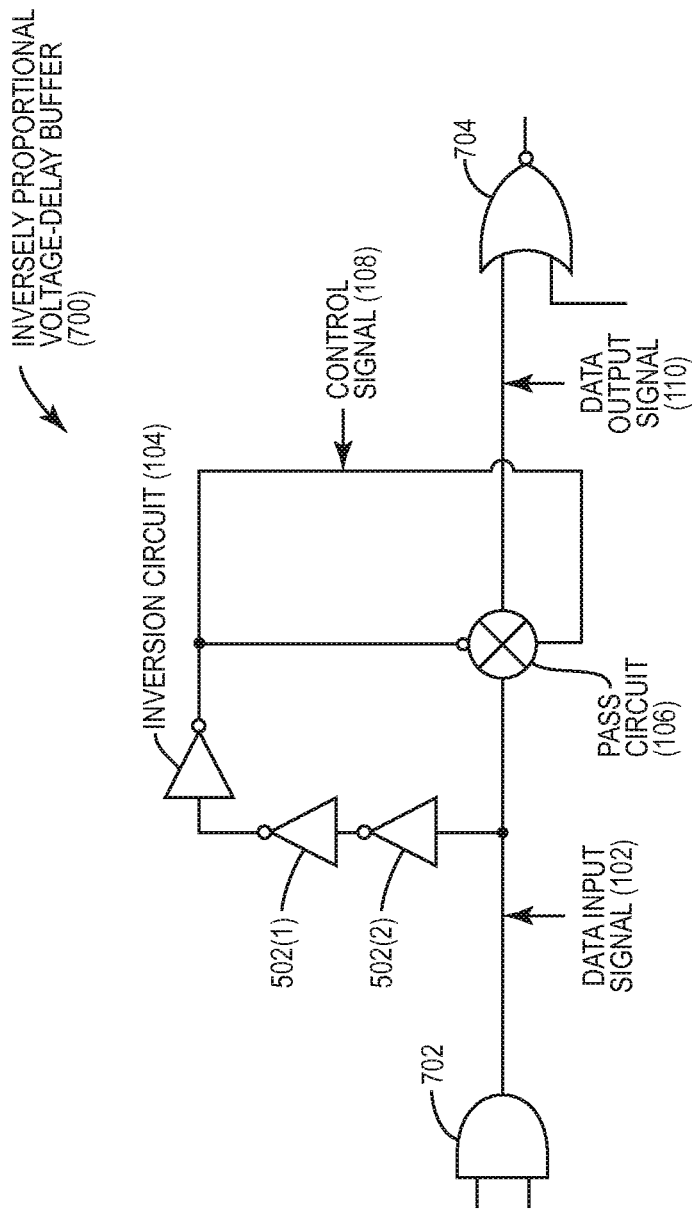
FIG. 7 is a logic diagram of another inversely proportional voltage-delay buffer that receives a data input signal from a logic gate and provides a data output signal to another logic gate.

Notably, circuit specifics of a particular logic path in which an instance of an inversely proportional voltage-delay buffer such as the inversely proportional voltage-delay buffers 100, 400, or 500 in FIG. 1, 4, or 5, respectively, is disposed may differ greatly among varying logic paths. In this manner, FIG. 7 is a logic diagram of an exemplary inversely proportional voltage-delay buffer 700 that includes a logic gate 702 (e.g., an AND-based gate 702) and a logic gate 704 (e.g., a NOR-based gate 704). The inversely proportional voltage-delay buffer 700 includes certain components in common with the inversely proportional voltage-delay buffer 500 in FIG. 5, which are shown with common element numbers between FIGS. 5 and 7, and thus, will not be re-described herein. In this example, the logic gate 702 is configured to receive data from a logic path and generate the data input signal 102. Further, the logic gate 702 is electrically coupled to the inversion circuit 104 and the pass circuit 106 such that the logic gate 702 provides the data input signal 102 to the inversion circuit 104 and the pass circuit 106. The logic gate 704 is electrically coupled to the pass circuit 106, and is configured to receive the data output signal 110 and generate data for the logic path. In this manner, the logic gate 702 and the logic gate 704 represent exemplary circuit elements from which the inversely proportional voltage-delay buffer 700 may receive the data input signal 102 or to which the inversely proportional voltage-delay buffer 700 may provide the data output signal 110.

Further, the elements described herein are sometimes referred to as means for performing particular functions. In this regard, the inversion circuit 104 is sometimes referred to herein as a means for generating the control signal 108 having an inverted logic state of the data input signal 102. The first pass device 112 is sometimes referred to herein as a means for generating the data output signal 110 having a weak logic state of the data input signal 102 in response to the data input signal 102 and the control signal 108 having the first logic state. The first pass device 112 is also sometimes referred to herein as a means for generating the data output signal 110 having a strong logic state of the data input signal 102 in response to the control signal 108 having the first logic state and the data input signal 102 having the second logic state. The second pass device 114 is sometimes referred to herein as a means for generating the data output signal 110 having a weak logic state of the data input signal 102 in response to the data input signal 102 and the control signal 108 having the second logic state. The second pass device 114 is also sometimes referred to herein as a means for generating the data output signal 110 having a strong logic state of the data input signal 102 in response to the control signal 108 having the second logic state and the data input signal 102 having the first logic state. Further, the inverters 502(1), 502(2) in FIG. 5 are sometimes referred to herein as a means for delaying the means for generating the control signal 108 based on the data input signal 102.

The inversely proportional voltage-delay buffers for buffering data according to data voltage levels according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 8:
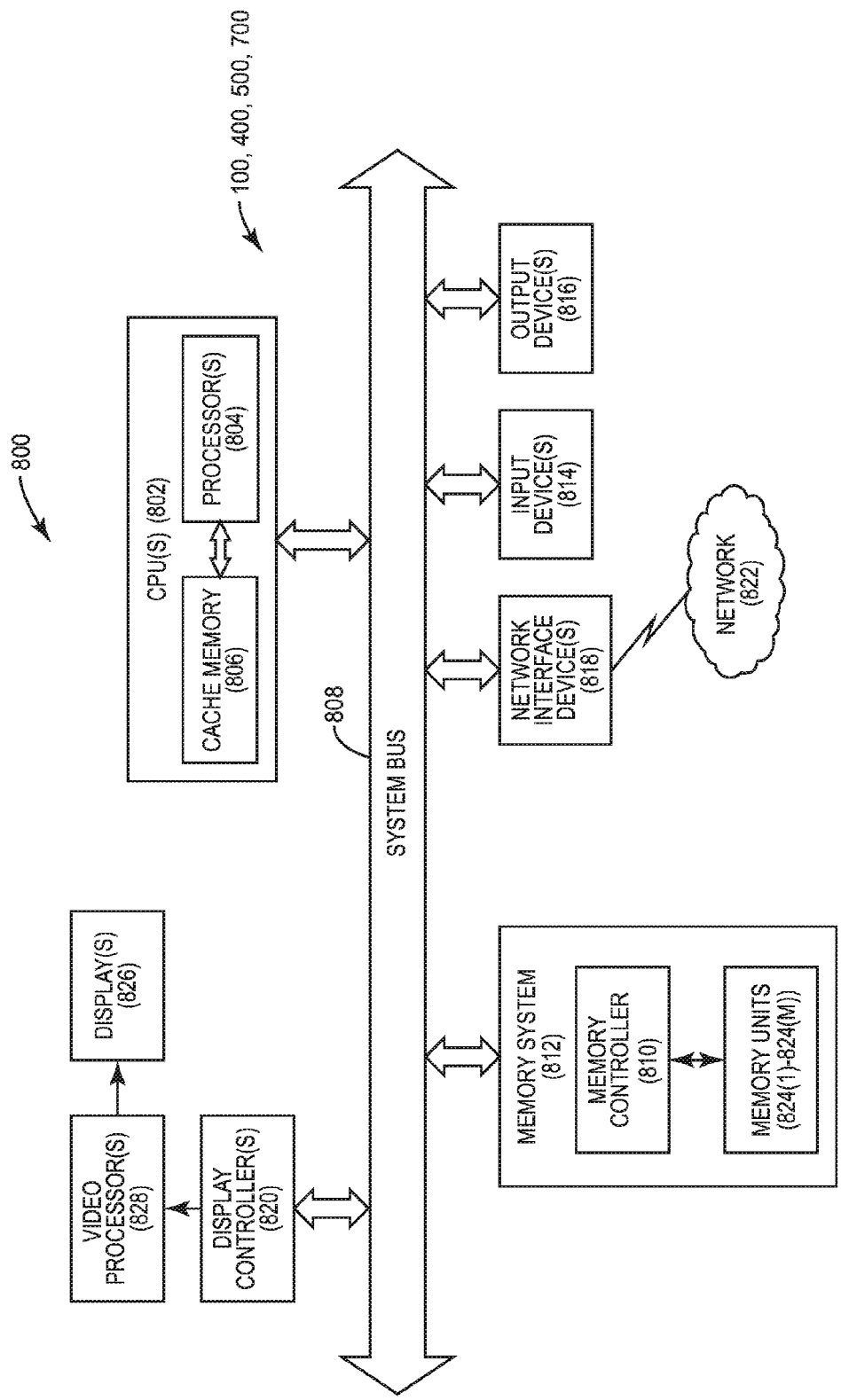
FIG. 8 is a block diagram of an exemplary processor-based system that can include the inversely proportional voltage-delay buffers in FIG. 1A, 1B, 4, 5, or 7.

In this regard, FIG. 8 illustrates an example of a processor-based system 800. Notably, any element described herein in relation to the processor-based system 800 can include any of the inversely proportional voltage-delay buffers 100, 400, 500, and 700 illustrated in FIGS. 1A, 1B, 4, 5, and 7. In this example, the processor-based system 800 includes one or more central processing units (CPUs) 802, each including one or more processors 804. The CPU(s) 802 may have cache memory 806 coupled to the processor(s) 804 for rapid access to temporarily stored data. The CPU(s) 802 is coupled to a system bus 808 and can intercouple master and slave devices included in the processor-based system 800. As is well known, the CPU(s) 802 communicates with these other devices by exchanging address, control, and data information over the system bus 808. For example, the CPU(s) 802 can communicate bus transaction requests to a memory controller 810 as an example of a slave device. Although not illustrated in FIG. 8, multiple system buses 808 could be provided, wherein each system bus 808 constitutes a different fabric.

Other master and slave devices can be connected to the system bus 808. As illustrated in FIG. 8, these devices can include a memory system 812, one or more input devices 814, one or more output devices 816, one or more network interface devices 818, and one or more display controllers 820, as examples. The input device(s) 814 can include any type of input device, including but not limited to input keys, switches, voice processors, etc. The output device(s) 816 can include any type of output device, including but not limited to audio, video, other visual indicators, etc. The network interface device(s) 818 can be any device configured to allow exchange of data to and from a network 822. The network 822 can be any type of network, including but not limited to a wired or wireless network, a private or public network, a local area network (LAN), a wireless local area network (WLAN), a wide area network (WAN), a BLUETOOTH™ network, or the Internet. The network interface device(s) 818 can be configured to support any type of communications protocol desired. The memory system 812 can include one or more memory units 824(1)-824(M).

The CPU(s) 802 may also be configured to access the display controller(s) 820 over the system bus 808 to control information sent to one or more displays 826. The display controller(s) 820 sends information to the display(s) 826 to be displayed via one or more video processors 828, which process the information to be displayed into a format suitable for the display(s) 826. The display(s) 826 can include any type of display, including but not limited to a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An inversely proportional voltage-delay buffer, comprising:
   an inversion circuit configured to generate a control signal having an inverted logic state of a data input signal, wherein a transition rate of the control signal is proportional to a voltage level of the data input signal;
   a pass circuit, comprising:
      a first pass device, configured to:
         generate a data output signal having a weak logic state of the data input signal in response to the data input signal and the control signal having a first logic state; and
         generate the data output signal having a strong logic state of the data input signal in response to the control signal having the first logic state and the data input signal having a second logic state, wherein the second logic state is opposite of the first logic state; and
      a second pass device, configured to:
         generate the data output signal having a weak logic state of the data input signal in response to the data input signal and the control signal having the second logic state; and
         generate the data output signal having a strong logic state of the data input signal in response to the control signal having the second logic state and the data input signal having the first logic state.

2. The inversely proportional voltage-delay buffer of claim 1, wherein:
   the first pass device comprises a p-type metal-oxide semiconductor (PMOS) transistor, comprising:
      a gate configured to receive the control signal;
      a source configured to receive the data input signal; and
      a drain configured to provide the data output signal; and
   the second pass device comprises an n-type metal-oxide semiconductor (NMOS) transistor, comprising:
      a gate configured to receive the control signal;
      a source configured to receive the data input signal; and
      a drain configured to provide the data output signal.

3. The inversely proportional voltage-delay buffer of claim 1, wherein the inversion circuit comprises an inverter.

4. The inversely proportional voltage-delay buffer of claim 1, wherein the inversion circuit comprises an odd number of serially-coupled inverters.

5. The inversely proportional voltage-delay buffer of claim 1, further comprising:
   an input inverter electrically coupled to the inversion circuit and the pass circuit, the input inverter configured to generate the data input signal and provide the data input signal to the inversion circuit and the pass circuit; and
   an output inverter electrically coupled to the pass circuit and configured to receive the data output signal.

6. The inversely proportional voltage-delay buffer of claim 1, wherein the data input signal is received from a logic gate.

7. The inversely proportional voltage-delay buffer of claim 1, wherein the data output signal is provided to a logic gate.

8. The inversely proportional voltage-delay buffer of claim 1 integrated into an integrated circuit (IC).

9. The inversely proportional voltage-delay buffer of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

10. An inversely proportional voltage-delay buffer, comprising:
    a means for generating a control signal having an inverted logic state of a data input signal, wherein a transition rate of the control signal is proportional to a voltage level of the data input signal;
    a means for generating a data output signal having a weak logic state of the data input signal in response to the data input signal and the control signal having a first logic state;
    a means for generating the data output signal having a strong logic state of the data input signal in response to the control signal having the first logic state and the data input signal having a second logic state, wherein the second logic state is opposite of the first logic state;
    a means for generating the data output signal having a weak logic state of the data input signal in response to the data input signal and the control signal having the second logic state; and
    a means for generating the data output signal having a strong logic state of the data input signal in response to the control signal having the second logic state and the data input signal having the first logic state.

11. The inversely proportional voltage-delay buffer of claim 10, further comprising a means for delaying the means for generating the control signal based on the data input signal.

12. A method for buffering a data input signal for an amount of time that is inversely proportional to a voltage level of the data input signal, comprising:
    generating a control signal having an inverted logic state of a data input signal, wherein a transition rate of the control signal is proportional to a voltage level of the data input signal;
    generating a data output signal having a weak logic state of the data input signal in response to the data input signal and the control signal having a first logic state;
    generating the data output signal having a strong logic state of the data input signal in response to the control signal having the first logic state and the data input signal having a second logic state, wherein the second logic state is opposite of the first logic state;
    generating the data output signal having a weak logic state of the data input signal in response to the data input signal and the control signal having the second logic state; and
    generating the data output signal having a strong logic state of the data input signal in response to the control signal having the second logic state and the data input signal having the first logic state.

13. The method of claim 12, further comprising delaying generating the control signal based on the data input signal.

14. An inversely proportional voltage-delay buffer, comprising:
    an inverter configured to generate a control signal having an inverted logic state of a data input signal, wherein a transition rate of the control signal is proportional to a voltage level of the data input signal;
    a pass gate, comprising:

a p-type metal oxide semi-conductor (PMOS) transistor, comprising:
- a gate configured to receive the control signal;
- a source configured to receive the data input signal; and
- a drain configured to provide a data output signal; and an n-type metal oxide semi-conductor (NMOS) transistor, comprising:
- a gate configured to receive the control signal;
- a source configured to receive the data input signal; and
- a drain configured to provide the data output signal.

15. The inversely proportional voltage-delay buffer of claim 14, wherein the inverter comprises a PMOS transistor and an NMOS transistor.

16. The inversely proportional voltage-delay buffer of claim 14, further comprising an even number of serially-coupled inverters configured to provide the data input signal to the inverter after a delay.

17. The inversely proportional voltage-delay buffer of claim 14, further comprising:
an input inverter electrically coupled to the inverter and the pass gate, the input inverter configured to generate the data input signal and provide the data input signal to the inverter and the pass gate; and
an output inverter electrically coupled to the pass gate and configured to receive the data output signal.

18. The inversely proportional voltage-delay buffer of claim 14, wherein the data input signal is received from a logic gate.

19. The inversely proportional voltage-delay buffer of claim 14, wherein the data output signal is provided to a logic gate.

20. The inversely proportional voltage-delay buffer of claim 14 integrated into an integrated circuit (IC).

21. The inversely proportional voltage-delay buffer of claim 14 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

* * * * *